United States Patent [19]

Romeo, Jr.

[11] Patent Number: 4,634,988

[45] Date of Patent: Jan. 6, 1987

[54] DETECTION OF UNSTABLE NARROWBAND SIGNALS

[75] Inventor: Frank P. Romeo, Jr., Saratoga, Calif.

[73] Assignee: The United States of America as represented by the Secretary of the Navy, Washington, D.C.

[21] Appl. No.: 218,848

[22] Filed: Jan. 18, 1972

[51] Int. Cl.$^4$ .............................................. H04B 15/00
[52] U.S. Cl. ..................................... 328/167; 307/520; 328/165
[58] Field of Search ................. 328/165, 167; 307/520

[56] References Cited

U.S. PATENT DOCUMENTS

| | | |
|---|---|---|
| 3,076,145 | 1/1963 | Copeland et al. ................... 328/165 |
| 3,374,435 | 3/1968 | Engel .............................. 328/165 X |
| 3,492,591 | 1/1970 | Shapiro ............................. 328/167 |
| 3,619,502 | 11/1971 | Croisier et al. ................. 328/167 X |
| 3,651,433 | 3/1972 | Langley ........................... 328/165 X |

Primary Examiner—Theodore M. Blum
Assistant Examiner—Mark Hellner
Attorney, Agent, or Firm—Arthur A. McGill; Prithvi C. Lall; Michael J. McGowan

[57] ABSTRACT

Unstable narrowband signals in a background of noise are detected. Aside from the condition that the center frequency changes slowly, nothing is known about the signal dynamics or the signal and noise power levels. The incoming signal is translated into a waveform that emphasizes the correlated components regardless of their instantaneous carrier frequencies. This invariance suppresses consideration of the wandering aspect of the signal and permits a test for the presence of any narrowband energy.

10 Claims, 12 Drawing Figures

DETECTION OF UNSTABLE NARROWBAND SIGNALS

BACKGROUND OF THE INVENTION

The present invention relates generally to the art of signal detection and particularly to the detection of narrowband signals in a background of noise.

In such fields as oceanography and seismology it is often necessary to detect the presence of unstable narrowband signals in a background of noise. To have optimum detection, it is necessary to know in advance certain properties of the signal and the noise. However, these properties are usually not known and therefore optimum detection is extremely difficult, if not impossible, to obtain.

SUMMARY OF THE INVENTION

Aside from the condition that the signal center frequency changes slowly, nothing is known about the signal dynamics or the signal and noise power levels. The excursions of the signal center frequency cover a band too broad for reasonable estimates of the noise level based on adjacent bands. The instant invention operates on the principle that the narrowband source produces energy with more coherence than the surrounding noise. The incoming signal is translated into a waveform that emphasizes the correlated components regardless of their instantaneous carrier frequencies. If one squares the incoming wave and integrates he would have an estimate of the average power (the Fourier component of the product at zero). At zero frequency there would be two Dirac deltas, one for the DC value of $n^2(t)$ and one for $s^2(t)$, where $n(t)$ and $s(t)$ are the noise and the narrowband signal, respectively. If the noise bandwidth is larger than that of the signal, a certain delay $\delta$ will cause $n(t)n(t+\delta)$ to have zero expectation while $s(t)$ and $s(t+\delta)$ are still correlated. Hence the noise power is reduced while the signal contribution remains essentially the same. The signals are frequency shifted and filtered to translate the delta from zero to a higher frequency $(\omega_2 - \omega_1)$ so as to avoid the possible negative effect of the uncontrollable phase $(\omega_c \delta)$, where $\omega_c$ is the center frequency of the narrowband signal. A significant advantage of the present invention is that in testing for the shape of the apparent power spectrum (as opposed to its area), the threshold for the test can be contingent on the total observed power. This makes it practical to build a system that compares the spectral component of the translated waveform to the total measured power.

DETAILED DESCRIPTION OF THE PREFERRED EMBODIMENT

Figure 1A:
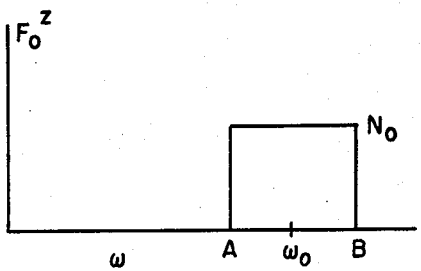
FIGS. 1a and 1b show graphically the spectral densities of the input signal without and with, respectively, the presence of a narrowband signal.

Spectral analysis is a classic approach for the detection of narrowband energy in a background of broadband noise. If the received signal $r(t)$ is observed for an interval of time $[O,T]$, $$X^i(O,T) = \int_0^T r(t)\cos(\omega_i t)dt, \text{ and} \qquad (1)$$

$$Y^i(O,T) = \int_0^T r(t)\sin(\omega_i t)dt, \text{ for } i = 1,2,\ldots \qquad (2)$$

are estimates of the coefficients in a harmonic representation of $r(t)$. An estimate of the power level at frequency $\omega_i$ is given by:

$$(Q^i(O,T))^2 = (X^i(O,T))^2 + (Y^i(O,T))^2. \qquad (3)$$

A tabulation of $(Q^i(O,T))^2$ for various values of $\omega_i$ is an estimate of the distribution of energy of $r(t)$ in the frequency domain. If $r(t)$ is noise only, $$r(t) = n(t),$$

the power spectral estimates $(Q^i(O,T))^2$ are usually expected to be similar to each other in that each is an estimate of the noise power spectrum which is assumed to be relatively smooth. When, on the other hand, a narrowband signal $s(t)$ is embedded in $r(t)$, $$r(t) = s(t) + n(t),$$

certain of the power estimates are expected to be somewhat larger. For example, if the center frequency of $s(t)$ is $\omega_c$, the estimator $(Q^c(O,T))^2$ has an inflated expected value when $s(t)$ is present.

A decision to accept the hypothesis that a signal is present based on a comparison of the relative magnitudes of power estimates has two obvious advantages. First, the accuracy of the estimates increases as the number of observations becomes larger, e.g., the average of $(Q^i(O,T))^2$ and $(Q^i(T,2T))^2$ is an improved estimate of the energy level at $\omega_i$. Secondly, the ratio of power at $\omega_c$ to that of adjacent frequencies is independent of the absolute value of the noise power level and therefore somewhat insensitive to assumptions on the uniformity of the background spectrum. Generally, a straightforward spectral analysis is a powerful, robust, data reduction technique for the detection of narrowband signals.

Consider now what happens to the analysis when the signal center frequency $\omega_c$ is not constant. Assume that:

$$\omega_c = \omega_c(t)$$

is a "slowly" changing variable. "Slowly" means that for a fixed T, $\omega_c(t)$ is essentially constant for an interval of length T but the value of $\omega_1(t)$ for $t \in [O,T]$ may be quite different from $\omega_2(\tau)$ for $\tau \in [NT, NT+T]$, where N is an arbitrary integer. Such a signal will increase the average values of $(Q^1(O,T))^2$ and $(Q^2(NT,NT+T))^2$ and of course all other estimators lying in the frequencytime trajectory of the signal center frequency.

When $\omega_c(t)$ is itself a random process, taking on values within a certain band of frequencies, there will be an obvious degradation with the afore mentioned detector. For long observations the spectral estimates may be increased by the signal energy over the entire range of $\omega_c(t)$. In fact, the value of ordinary spectral analysis diminishes rapidly as the range of $\omega_c(t)$ expands to widths for which the noise power spectrum can no longer be considered flat.

After observing the received waveform r(t) for an interval [O,KT] a decision is made whether or not r(t) includes signal s(t). (K is an integer and T is specified below.) To say that it does, constitutes acceptance of the hypothesis $H_1$, $$r(t)=n(t)+s(t).$$

Acceptance of the alternative $H_o$ is the decision that r(t) is noise only, $$r(t)=n(t).$$

Attention is restricted to a finite band of frequencies [A,B] so the flat spectrum noise process n(t) may be thought of as the result of passing white Gaussian noise through an ideal bandpass filter of width (B−A).

The signal s(t) behaves like a narrowband Gaussian process when observed for short periods but its center frequency fluctuates within the band [A,B]. The apparent narrowband-bandwidth is $2\alpha$, so observations of length of the order of $T=1/2\alpha$ are sufficient to ascertain the value of the center $\omega_c(t)$. The center frequency, on the other hand, changes slowly enough to be assumed constant for T seconds.

Figure 1B:
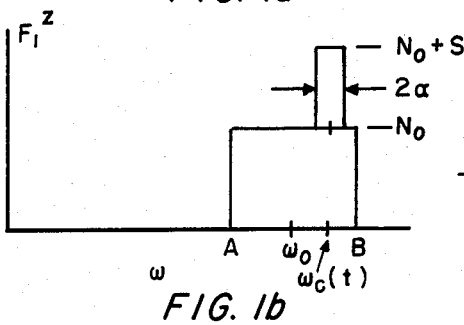

The signal can be visualized as the result of passing white Gaussian noise through an ideal tunable filter of bandwidth $2\alpha$. The center frequency of the filter, $\omega_c(t)$, varies slowly between $(A+\alpha)$ and $(B-\alpha)$. The "apparent" spectral densities are exhibited graphically in FIG. 1. The density for the noise $F_o^z$ is constant at value $N_o$ (FIG. 1a). When $H_1$ is true, estimates of the spectrum are biased upward by the amount S in the interval $[\omega_c(t)-\alpha, \omega_c(t)+\alpha]$. The result of a short term (observation time is T seconds) spectral analysis is expected to look like $F_1^z$ (FIG. 1b).

Figure 2:
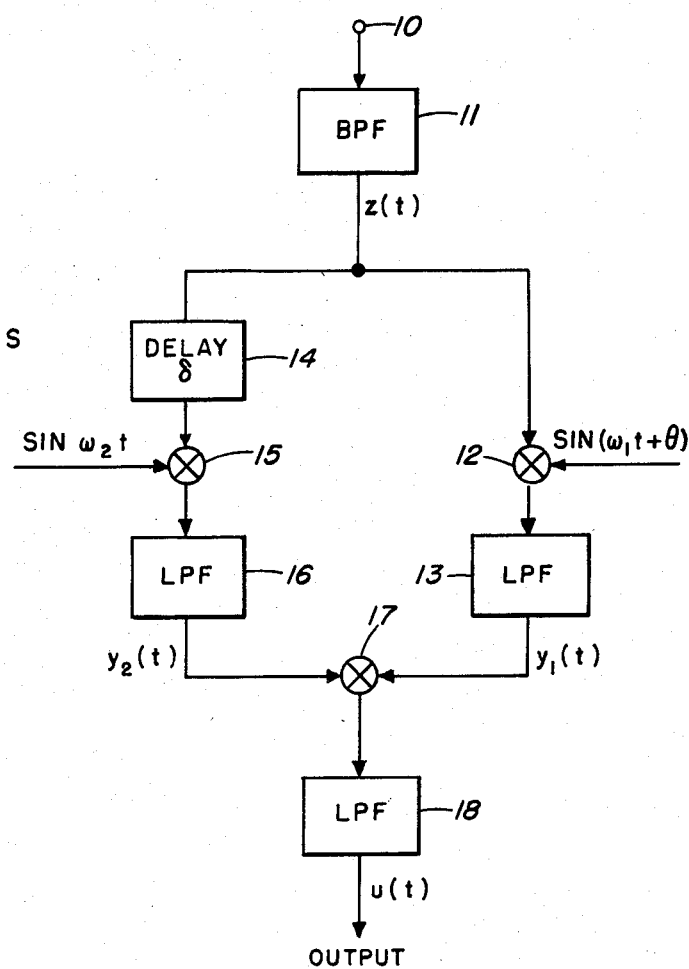
FIG. 2 is a schematic block diagram of a section of a detector embodying the principles of this invention.

The transformation system is depicted in FIG. 2. Transducer 10, of any well known design, generates an electrical waveform representing a received signal. The waveform is passed through a bandpass filter 11 which restricts the signal z(t) to energy in the band [A,B], centered on $\omega_o$. When $H_o$ is true, called the noise only case, $z(t)=n(t)\cos(\omega_o t+\theta(t))$ where N(t) is a Rayleigh distributed slowly varying amplitude and $\theta(t)$ is a slowly varying phase with a uniform distribution on $[-\pi,\pi]$. The z(t) process can alternatively be represented:

$$z(t)=X_c^N(t)\cos(\omega_o t)+X_s^N(t)\sin(\omega_o t),$$

where $X_c^N(t)=N(t)\cos\theta(t)$, and $X_s^N(t)=N(t)\sin\theta(t)$, are independent narrowband Gaussian processes with zero center frequency.

The output of one branch $y_1(t)$ is the result of multiplying z(t) in multiplying network 12 by a randomly phased sinusoid with frequency $\omega_1$ and passing the product through low pass filter 13:

$$y_1(t)=(\tfrac{1}{2})N(t)\cos[(\omega_1-\omega_o)t-\theta-\theta(t)].$$

The output of the other branch $y_2(t)$ is the result of delaying z(t) by $\delta$ seconds in delay network 14, which may be variable, multiplying it in multiplying network 15 by a sinusoid with frequency $\omega_2$ and passing the product through lowpass filter 16:

$$y_2(t)=(\tfrac{1}{2})N(t+\delta)\cos[(\omega_2-\omega_o)t-\omega_o\delta-\theta(t+\delta)].$$

$y_1(t)$ and $y_2(t)$ are then multiplied with each other in multiplying network 17 and the product is passed through low pass filter 18. Thus, the output of the system u(t) is the low frequency component of the product of $y_1(t)$ and $y_2(t)$, $$u(t)=(\tfrac{1}{8})N(t)N(t+\delta)\cos[(\omega_2-\omega_1)t-\omega_o\delta-\theta(t+\delta)+\theta(t)].$$

It is not necessary but easier to visualize if:

$$(\omega_2-\omega_1)\geq(B-A).$$

The autocorrelation of u(t) is given by:

$$R_o^u(\tau)=E(u(t)u(t+\tau))$$
$$=(1/32)\cos[(\omega_2-\omega_1)\tau][(R^N(\tau))^2+(R^N(\delta))^2],$$

where $$R^N(\tau)=E(X_c^N(t)X_c^N(t+\tau))=E(X_s^N(t)X_s^N(t+\tau))$$
$$=2\int_A^B N_o\cos[(\omega-\omega_o)\tau]d\omega,$$

and $N_o$ is the level of the noise spectral density.

When the signal is present ($H_1$ is true) z(t) is the sum of two independent processes.

$$z(t)=N(t)\cos[\omega_o t+\theta(t)]+S(t)\cos(\omega_c(t)t+\phi(t)).$$

The "instantaneous spectrum" of the signal component has amplitude S in a $2\alpha$ band within [A,B]. In what follows the approximation is made that:

$$\omega_c(t_1)=\omega_c(t_2)=\omega_c$$

for $t_1$ and $t_2$ such that:

$$|t_2-t_1|\leq T+\delta.$$

With an expansion similar to the noise only case, $$y_1(t)=(\tfrac{1}{2})\{X_c^N(t)\cos[(\omega_1-\omega_o)t-\theta]+$$
$$X_s^N(t)[\sin(\omega_1-\omega_o)t-\theta]+X_c^S(t)\cos[(\omega_1-\omega_c(t))t-\theta]+$$
$$X_c^S(t)\sin[(\omega_1-\omega_c(t))t-\theta]\},$$

$$y_2(t)=(\tfrac{1}{2})\{X_c^N(t+\delta)\cos[(\omega_2-\omega_o)t-\omega_o\delta]+$$
$$X_s^N(t+\delta)\sin[(\omega_2-\omega_o)t-\omega_o\delta]+$$
$$X_c^S(t+\delta)\cos[(\omega_2-\omega_c(t))t-\omega_c(t)\delta]+$$

-continued
$$X_s^S(t+\delta)\sin[(\omega_2 - \omega_c(t))t - \omega_c(t)\delta]\},$$

where use has been made of:

$$S(t)\cos(\omega_c(t)t + \phi(t)) = X_c^S(t)\cos(\omega_c(t)t) + X_s^S(t)\sin(\omega_c(t)t),$$

and $$X_c^S(t) = S(t)\cos(\phi(t));\ X_s^S(t) = S(t)\sin(\phi(t)).$$

Finding the autocorrelation of u(t) in this case is tedious but straightforward, $$R_1^u(\tau) = (1/32)\{\cos[(\omega_2 - \omega_1)\tau][(R^N(\tau))^2 +$$

$$(R^S(\tau))^2]\} + (R^N(\delta) + R^S(\delta))^2] +$$

$$(1/32)[R^N(\tau)R^S(\tau)\cos[(\omega_2 - \omega_1 - \omega_o + \omega_c)\tau]] +$$

$$R^N(\tau)R^S(\tau)\cos[(\omega_2 - \omega_1 + \omega_o - \omega_c)\tau],$$

where $$R^S(\tau) = 2\int_{\omega_c - \alpha}^{\omega_c + \alpha} S\cos[(\omega - \omega_c(t))\tau]d\omega.$$

The spectral density of the output of the system in FIG. 2 is available by Fourier transforming the above autocorrelations.

Figure 3A:
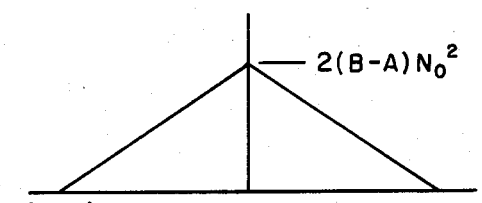
FIG. 3a shows graphically the convolution of the function graphed in FIG. 1a with itself.
Figure 3B:
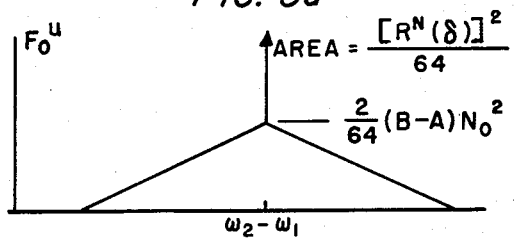
FIG. 3b is a graph of the positive half of the noise-only spectral density shifted away from the origin.

The final test statistic is the estimated power density of u(t) at frequency $(\omega_2 - \omega_1)$. Its distribution may be derived by first transforming $R_o^u$ and $R_1^u$. The transform of $(R^N(\tau))^2$ is the convolution of the transform of $R^N(\tau)$ with itself. The convolution of the function graphed in FIG. 1a with itself appears in FIG. 3a. The transform of $(R^N(\delta))^2$ is a Dirac delta at the origin. The effect of $(1/32)\cos[(\omega_2 - \omega_1)\tau]$ is to shift the spectrum away from the origin. FIG. 3b is a graph of the positive half of the spectral density of u(t) for the noise only case $F_o^u$.

Figure 4A:
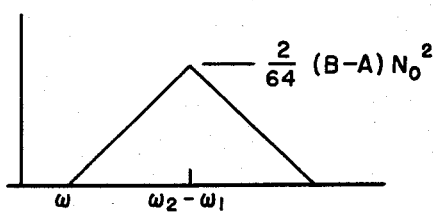
FIGS. 4a–d are graphs of the terms of the convolution when the signal is present.

The easiest way to derive the spectrum when the signal is present is to consider each term graphically. Both the noise and signal spectra are convolved with themselves. The contributions from $(R^N(\tau))^2$ and $(R^2(\tau))^2$ are displayed in FIGS. 4a and 4b, respectively. The cross terms of signal and noise appear in FIGS. 4c and 4d. Notice that the height of the spectrum at $(\omega_2 - \omega_1)$ is the same for all values of $\omega_c(t)$ provided:

$$A + \alpha \leq \omega_c(t) \leq B - \alpha.$$

There is a Dirac delta of weight:

$$(1/64)(R^N(\delta) + R^S(\delta))^2,$$

centered at $(\omega_2 - \omega_1)$.

Figure 5A:
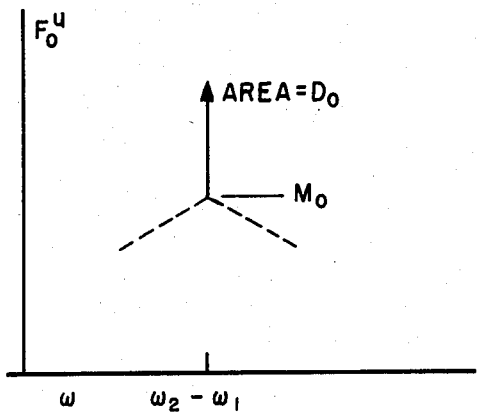
FIGS. 5a and 5b are graphs of components of the spectrum when the narrowband signal is not present and is present, respectively.

In summary, at $(\omega_2 - \omega_1)$ radians per second, the spectrum of u(t) has a continuous component of level $M_o$ or $M_1$ and a Dirac delta of area $D_o$ or $D_1$. When $H_o$ is true (FIG. 5a), $$M_o = (2/64)(B - A)N_o^2,\ \text{and}$$

$$D_o = (1/64)\ R^N(\delta)^2.$$

Figure 5B:
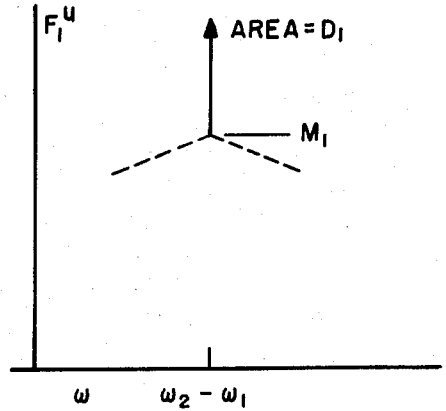

When $H_1$ is true (FIG. 5b), $$M_1 = (2/64)\ [(B - A)N_o^2 + 2\alpha S^2 + 4\alpha SN_o],\ \text{and}$$

$$D_1 = (1/64)(R^N(\delta) + R^S(\alpha))^2.$$

Figure 4B:
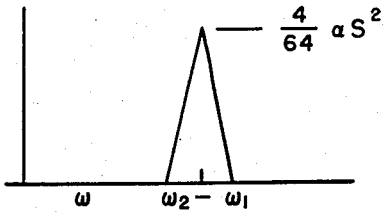
Figure 4C:
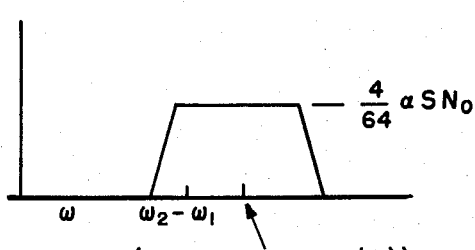
Figure 4D:
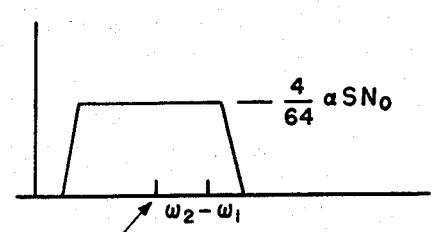

Obviously the spectrum of u(t) falls away from $(\omega_2 - \omega_1)$ more rapidly when $H_1$ is true (consider the component in FIG. 4b). It is assumed in the following that the observation period is long enough to resolve the energy level fairly accurately at $(\omega_2\omega_1)$. It is therefore valid to consider the continuous spectrum to be flat at level either $M_o$ or $M_1$.

Figure 6:
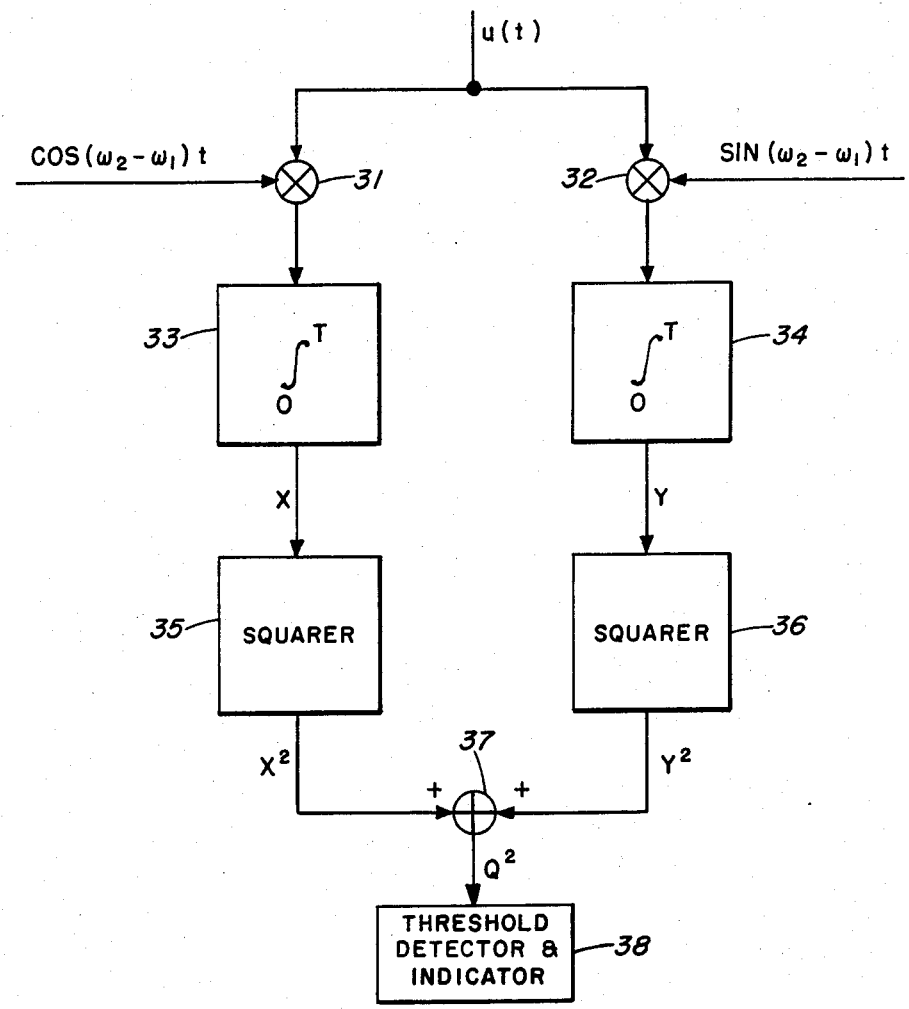
FIG. 6 is a schematic block diagram of a second section of a detector embodying the principles of this invention.

The energy at $(\omega_2 - \omega_1)$ is measured with the system shown in FIG. 6. This system is designed to perform on u(t) the mathematical operations of formulas (1), (2) and (3). The integrands of (1) and (2) are obtained by multiplying u(t) by $\cos(\omega_2 - \omega_1)t$ and $\sin(\omega_2 - \omega_1)t$ in multiplying networks 31 and 32 respectively. The products are integrated in integrating networks 33 and 34 to obtain X and Y, which are then squared in 35 and 36. The flat spectrum assumption mentioned above means that T must be long enough so that the power level at $(\omega_2 - \omega_1 \pm 1/T)$ does not differ significantly from at $(\omega_2 - \omega_1)$. $Q^2$, of formula (3), is obtained by adding $X^2$ and $Y^2$ in adding network 27. $Q^2$ is fed into threshold detector and indicator 38. The threshold levels to be used can be determined mathematically or empirically and are to some extent dependent on the choice of the operator as to the desired probability of detection, allowable false alarm probability, and detection time. Uncontrollable physical variables such as signal-to-noise ratio, presence of interferring signals, degree of signal coherence, and noise coherence are also factors relating to the useful threshold levels. The various networks, as well as the threshold detector, referred to above are devices well known in the signal processing art and thus are not described in detail.

In order to understand the effect of the Dirac delta in the spectrum, consider for a moment the random process:

$$d(t) = 2\sqrt{D}\cos[(\omega_2 - \omega_1)t + \psi],$$

where D is a constant and $\psi$ is uniformly distributed on $[-\pi, \pi]$. The spectral density of the d(t) process is a pair of Dirac deltas at $\pm(\omega_2 - \omega_1)$ with weight (or area)D. If d(t) alone is the input to the system of FIG. 6, $$X = \int_o^T 2\sqrt{D}\cos[(\omega_2 - \omega_1)t + \psi]\sin[(\omega_2 - \omega_1)t]dt$$

$$= -T\sqrt{D}\sin\psi,\ \text{and}$$

$$Y = T\sqrt{D}\cos\psi.$$

Since the final statistic will be:

$$Q^2 = X^2 + Y^2 = T^2D,$$

for all values of $\psi$, nothing is lost by assuming $$\psi = 3\pi/2,\ \text{so}$$

$$X = T\sqrt{D}\ \text{and}\ Y = 0.$$

Thus the effect of $D_o$ or $D_1$ in the input spectrum can be accounted for by adding $T\sqrt{D}$ to X and leaving Y at zero.

If noise of uniform spectral level M is also put into the system, $$E(X - T\sqrt{D})^2 = EY^2$$
$$= \int_0^T \int_0^T M\delta(t_1 - t_2)\sin[(\omega_2 - \omega_1)t_1]\sin[(\omega_2 - \omega_1)t_2]dt_1 dt_2$$
$$= TM/2.$$

Since both X and Y are the result of integrations, it is a fair assumption that they are Gaussian, hence $(X-T\sqrt{D})$ and Y are normally distributed with zero means and variance TM/2.

Finally, the variable given by:

$$\frac{Q^2}{TM/2} = \frac{X^2 + Y^2}{TM/2},$$

has a non-central chi-squared distribution with two degrees of freedom. The non-centrality parameter $\lambda$ is $$\lambda = \frac{2DT}{M}.$$

The only quantity in the spectra dependent on the delay $\delta$ is the magnitude of the dirac Deltas $D_o$ and $D_1$. The narrow appearance of the signal spectrum means that the signal autocorrelation $R^S(\tau)$ falls off much more slowly than the autocorrelation $R^N(\tau)$ of the noise. Herein lies a significant advantage of the process. By proper choice of $\delta$ it is possible to make $D_1$ much larger than $D_o$ and so maximize the separation of signal and noise statistics.

For example, for the rectangular spectra assumed in this model, $$R^N(\tau) = 2(B - A)N_o\left(\frac{\sin(B - A)\pi\tau}{(B - A)\pi\tau}\right), \text{ and}$$

$$R^S(\tau) = 4\alpha S\left(\frac{\sin 2\alpha\pi\tau}{2\alpha\pi\tau}\right).$$

The first zero crossing of $R^N(\tau)$, $1/(B-A)$, is hypothetically much less than $\frac{1}{2}\alpha$. If the delay $\delta$ is judiciously chosen several times larger than $1/(B-A)$ (yet only a fraction of $\frac{1}{2}\alpha$), there will be little error in assuming:

$$R^N(\delta)=0 \text{ and } R^S(\delta)=R^S(0).$$

When this condition exists, $$D_o=0, \text{ and}$$

$$D_1=(1/64)(R^S(0))^2=(\tfrac{1}{4})(\alpha S)^2.$$

A time domain realization of the system has been discussed. As such, the statistical modeling of the signal and noise are reasonably tractable problems. A frequency domain realization of the system has also been derived and constructed. An algorithm based on the manipulation of 5 second spectral estimates is used to detect a narrow band signal in 10 Hz (57 to 67 Hz band) section of a lofargram representation of a segment of ocean data. A calculation of the algorithm and the moments of the test statistic in the frequency domain are extremely complicated and extensive, and so they are omitted for sake of brevity.

Obviously, many modifications and variations of the present invention are possible in light of the above teachings. For example, the invention is amendable to implementation by digital, rather than analog, methods. It is therefore to be understood that, within the scope of the appended claims, the invention may be practiced otherwise than as specifically described.

What is claimed is:

1. Apparatus for detecting a varying narrow band signal in a background of noise which comprises:
   means for generating an electrical signal in response to an acoustical signal;
   means for delaying said electrical signal to produce a delayed electrical signal;
   means for multiplying said delayed electrical signal with a sinusoid of a first frequency;
   means for multiplying said electrical signal with a sinusoid of a second frequency;
   means for multiplying said multiplied delayed electrical signal with said multiplied electrical signal to produce a test signal; and
   means for testing the test signal for the presence of the narrow band signal.

2. The apparatus of claim 1 further including a band pass filter connected to the output of the electrical signal generating means.

3. The apparatus of claim 2 further including a low pass filter in the path of said test signal.

4. The apparatus of claim 2 wherein said delay means is variable.

5. The apparatus of claim 2 further including a first low pass filter in the path of said multiplied electrical signal and a second low pass filter in the path of said delayed multiplied electrical signal.

6. The apparatus of claim 2 wherein said testing means include a threshold detector.

7. A method of detecting the presence of a narrow band signal in an input signal containing noise which comprises:
   splitting the input signal into a first and a second part;
   delaying the first part of the input signal;
   multiplying said first part of the input signal with a sinusoid of a first frequency;
   multiplying said second part of the input signal with a sinusoid of a second frequency;
   combining said multiplied first and second parts of the input signal to produce a test signal in which the correlated components are emphasized; and
   testing said test signal for the presence of the correlated components.

8. The method of claim 7 which further includes passing said input signal through a band pass filter.

9. The method of claim 8 which further includes passing the test signal through a low pass filter.

10. The method of claim 8 wherein the step of testing said test signal includes estimating the power level of the test signal.

* * * * *